US012620534B2

(12) United States Patent
Zhang et al.

(10) Patent No.: US 12,620,534 B2
(45) Date of Patent: May 5, 2026

(54) FILM CAPACITOR ON A GLASS SUBSTRATE

(71) Applicant: Intel Corporation, Santa Clara, CA (US)

(72) Inventors: Chong Zhang, San Jose, CA (US); Cheng Xu, Chandler, AZ (US); Junnan Zhao, San Jose, CA (US); Ying Wang, Chandler, AZ (US); Meizi Jiao, San Jose, CA (US)

(73) Assignee: Intel Corporation, Santa Clara, CA (US)

( * ) Notice: Subject to any disclaimer, the term of this patent is extended or adjusted under 35 U.S.C. 154(b) by 348 days.

(21) Appl. No.: 17/557,572

(22) Filed: Dec. 21, 2021

(65) Prior Publication Data

US 2023/0197351 A1     Jun. 22, 2023

(51) Int. Cl.
| | |
|---|---|
| *H01G 4/33* | (2006.01) |
| *H01G 4/008* | (2006.01) |
| *H01G 4/12* | (2006.01) |
| *H01G 4/224* | (2006.01) |
| *H10D 1/68* | (2025.01) |
| *H10D 86/85* | (2025.01) |

(52) U.S. Cl.
CPC .............. *H01G 4/33* (2013.01); *H01G 4/008* (2013.01); *H01G 4/1209* (2013.01); *H01G 4/224* (2013.01); *H10D 1/696* (2025.01); *H10D 86/85* (2025.01)

(58) Field of Classification Search
CPC .......... H01G 4/005; H01G 4/236; H01G 4/33; H10D 1/68; H10D 1/692; H10D 86/85
See application file for complete search history.

(56) References Cited

U.S. PATENT DOCUMENTS

| | | | | |
|---|---|---|---|---|
| 2002/0056869 A1* | 5/2002 | Morimoto | ............ | H10D 84/215 |
| | | | | 257/E27.049 |
| 2007/0152295 A1* | 7/2007 | Yeh | ........................ | H10D 1/692 |
| | | | | 257/516 |
| 2011/0147055 A1* | 6/2011 | Ma | .................... | H01L 23/49822 |
| | | | | 29/830 |
| 2012/0307470 A1* | 12/2012 | Arai | ........................ | H05K 7/06 |
| | | | | 361/783 |
| 2013/0270675 A1* | 10/2013 | Childs | .................... | H10D 1/692 |
| | | | | 257/532 |

* cited by examiner

*Primary Examiner* — Nathan Milakovich
(74) *Attorney, Agent, or Firm* — Schwabe, Williamson & Wyatt, P.C.

(57)     ABSTRACT

Embodiments herein relate to systems, apparatuses, or processes directed to packages that include one or more glass cores that have thin film capacitors on one or more sides of the one or more glass cores. The film capacitors may be formed in-situ on the glass cores during substrate manufacturing. Other embodiments may be described and/or claimed.

23 Claims, 10 Drawing Sheets

FILM CAPACITOR ON A GLASS SUBSTRATE

FIELD

Embodiments of the present disclosure generally relate to the field of package assemblies, and in particular to packages that include glass cores.

BACKGROUND

Continued reduction in the size of mobile electronic devices, such as smart phones and ultrabooks, is a driving force for reducing package sizes and increasing the quality of components within packages.

DETAILED DESCRIPTION

Figure 1:
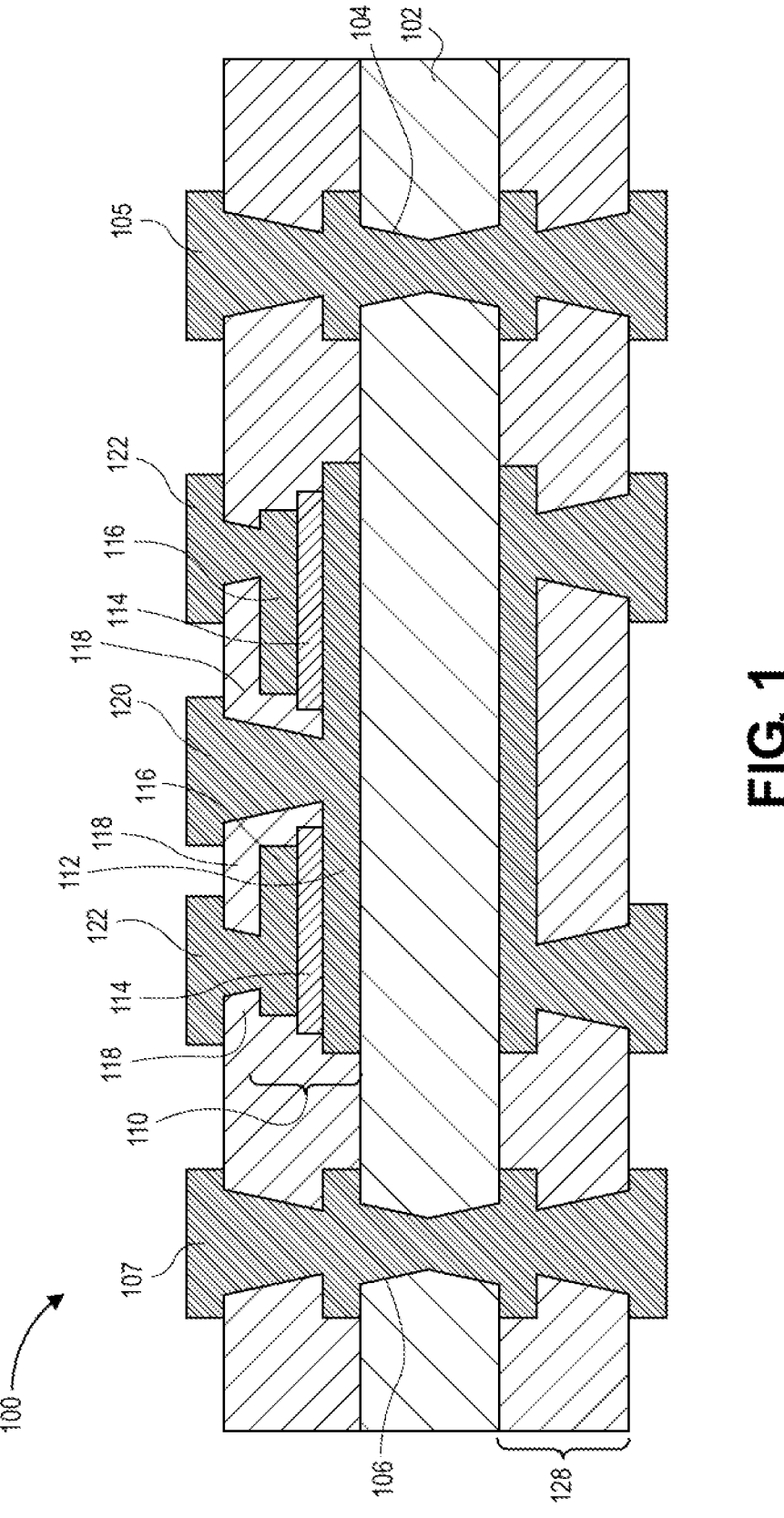
FIG. 1 illustrates a side view cross section of a package with a glass core with a thin film capacitor on a side of the glass core, in accordance with various embodiments.

Embodiments of the present disclosure may generally relate to systems, apparatus, and/or processes directed to packages that include glass cores that have thin film capacitors coupled with one or more sides of the glass cores. In embodiments, these thin film capacitors may be formed in-situ on the glass cores during substrate manufacturing. In embodiments, these thin film capacitors may be layered on top of each other to create additional capacitance with a minimum increase of Z-height.

In embodiments, thin film capacitors may be designed so that they are closer and have a shorter electrical routing path to a die that is attached to the glass core. The shorter electrical routing path may be significantly shorter than electrical routing paths of discrete capacitors, for example either land side capacitors (LSC) or die side capacitors (DSC). In embodiments, the thin film capacitors may include a first metal layer formed on a surface of the glass core, with a dielectric film on top of the first metal layer, and a second metal layer on top of the dielectric film.

In legacy implementations, capacitors are typically implemented on a substrate interconnect and provide power delivery to dies, such as CPUs, coupled with the substrate interconnect. In these legacy implementations, DSCs and LSCs may be used. DSCs typically have smaller size because the front side of a legacy package does not have much space, and the power supplied is likely limited because the electrical connection is made horizontally through power traces. In legacy implementations, LSCs can occupy more space and are connected to CPU die through vertical stacked via connections. However, because LSCs are relatively far away from CPU die, these legacy implementations have reduced power delivery performance.

In addition, with legacy implementations, external discreet capacitors may be expensive to purchase, and may provide challenges during manufacturing. For example, implementing capacitor materials in a package requires an annealing temperature that is much higher than the melting point of an organic substrate that may exist within a legacy package. In addition, legacy capacitors may be bulky and have a Z-height that constrains package design. In addition, many legacy components are attached at a back side of the substrate, which may be relatively far away from a CPU die on the other side of the substrate creating a longer electrical routing path.

In embodiments described herein, the capacitor structures are embedded within the package on a glass core. As a result, Z-height constraints and form factor constraints are greatly reduced as compared to legacy implementations. In addition, the effect of high annealing temperatures for capacitor materials during manufacture of the package. Because a glass core instead of a legacy organic core is used, the glass core is far less likely to degrade or deform even at sintering temperatures. For example, a film dielectric that includes $BaTiO_3$ may require temperatures around 900° C. during manufacture. Glass materials that may be used to create glass cores have various softening temperatures that may range from 700 to 1500° C. In addition, in embodiments, a thinner film dielectric, resulting in a higher capacitance, may be placed due to the flatness (planarity) and firmness of the sides of the glass core.

Note that although embodiments described herein are primarily directed to capacitors, inductors may also be created using these techniques. For example, inductors may be created within the package by replacing the film dielectric material with a magnetic material.

In the following detailed description, reference is made to the accompanying drawings which form a part hereof, wherein like numerals designate like parts throughout, and in which is shown by way of illustration embodiments in which the subject matter of the present disclosure may be practiced. It is to be understood that other embodiments may be utilized and structural or logical changes may be made without departing from the scope of the present disclosure. Therefore, the following detailed description is not to be taken in a limiting sense, and the scope of embodiments is defined by the appended claims and their equivalents.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B and C).

The description may use perspective-based descriptions such as top/bottom, in/out, over/under, and the like. Such descriptions are merely used to facilitate the discussion and are not intended to restrict the application of embodiments described herein to any particular orientation.

The description may use the phrases "in an embodiment," or "in embodiments," which may each refer to one or more of the same or different embodiments. Furthermore, the terms "comprising," "including," "having," and the like, as used with respect to embodiments of the present disclosure, are synonymous.

The term "coupled with," along with its derivatives, may be used herein. "Coupled" may mean one or more of the following. "Coupled" may mean that two or more elements are in direct physical or electrical contact. However, "coupled" may also mean that two or more elements indirectly contact each other, but yet still cooperate or interact with each other, and may mean that one or more other elements are coupled or connected between the elements that are said to be coupled with each other. The term "directly coupled" may mean that two or more elements are in direct contact.

Various operations may be described as multiple discrete operations in turn, in a manner that is most helpful in understanding the claimed subject matter. However, the order of description should not be construed as to imply that these operations are necessarily order dependent.

As used herein, the term "module" may refer to, be part of, or include an ASIC, an electronic circuit, a processor (shared, dedicated, or group) and/or memory (shared, dedicated, or group) that execute one or more software or firmware programs, a combinational logic circuit, and/or other suitable components that provide the described functionality.

Various Figures herein may depict one or more layers of one or more package assemblies. The layers depicted herein are depicted as examples of relative positions of the layers of the different package assemblies. The layers are depicted for the purposes of explanation, and are not drawn to scale. Therefore, comparative sizes of layers should not be assumed from the Figures, and sizes, thicknesses, or dimensions may be assumed for some embodiments only where specifically indicated or discussed.

FIG. 1 illustrates a side view cross section of a package with a glass core with a thin film capacitor on a side of the glass core, in accordance with various embodiments. Package 100 includes a glass core 102 that includes a first via 104 and a second via 106 that extend through the glass core 102 and are filled with electrically conductive material. The electrically conductive material may include copper. A pad 105 is electrically and physically coupled to the first via 104, and a pad 107 is electrically and physically coupled to the second via 106. In embodiments, glass core 102 may be referred to as a glass layer, a glass sheet, glass carrier panel, or a glass substrate. In embodiments, the first via 104 and the second via 106 may be formed using techniques described below with respect to FIG. 6.

A capacitor 110, which may also be referred to as a thin film capacitor, may be formed on a side of the glass core 102. In embodiments, the capacitor 110 includes a first metal layer 112, a film dielectric 114 placed on the first metal layer 112, and a second metal layer 116 formed on top of the film dielectric 114. In embodiments, the film dielectric 114 may be referred to as a dielectric, a thin film dielectric, or a capacitor film. In embodiments, the film dielectric 114 may be formed on the first metal layer 112 through vapor deposition techniques, spin coating, slit coating, printing, including inkjet printing, and/or sputtering of the film dielectric material. Examples of the film dielectric 114 include BaTiO3, tantalum, or other dielectric material.

In embodiments, the first metal layer 112 is electrically isolated from the second metal layer 116. In embodiments, the first metal layer 112 and the second metal layer 116 may include copper, or may include some other electrically conductive element such as nickel or aluminum. In embodiments, a thickness of the first metal layer 112 and/or the second metal layer 116 may range from 5 to 25 μm.

An electrical coupling 120, which may be a copper pad that is electrically coupled with the first metal layer 112, provides an electrical coupling at a side of the package 100. Other pads 122 may be electrically coupled with the second metal layer 116 and provide an electrical coupling at the same side of the package 100. In this way, the capacitor 110 may be located within the package 100 and on one side of the glass core 102, providing a short electrical path to a die (not shown) electrically coupled with the top of the glass core 102. In embodiments, other electrical routing layers and features 128 may be formed on the opposite side of the glass core 102. In embodiments, a dielectric material 118 may be placed within the package 100 to electrically isolate components as discussed above.

Figure 2:
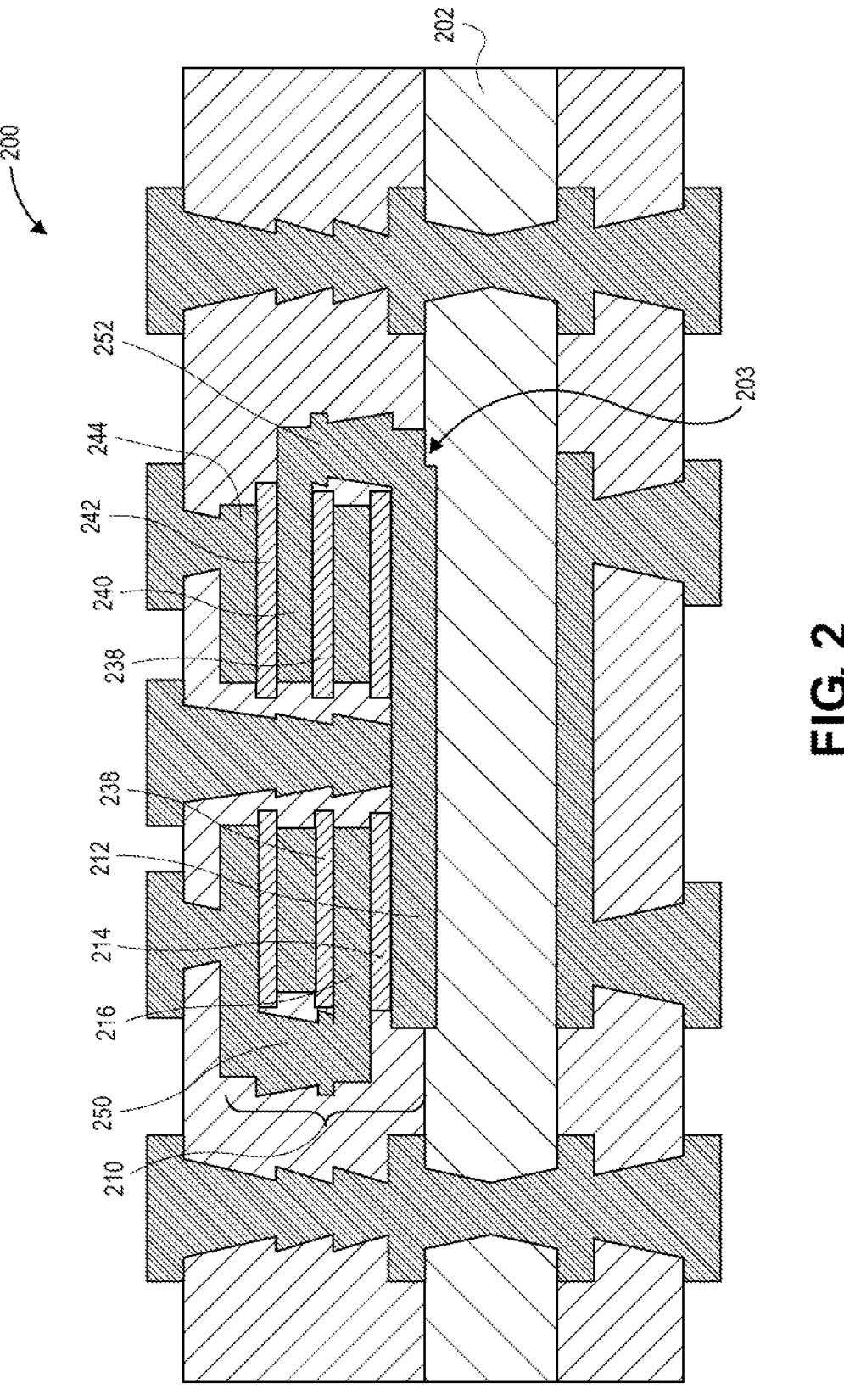
FIG. 2 illustrates a side view cross section of a package with a glass core that includes a recess on a side of the glass core with a stacked multi-layer thin film capacitor within a part of the recess, in accordance with various embodiments.

FIG. 2 illustrates a side view cross section of a package with a glass core that includes a recess on a side of the glass core with a stacked multi-layer thin film capacitor within a part of the recess, in accordance with various embodiments. Package 200, which may be similar to package 100 of FIG. 1, includes a glass core 202 and a capacitor 210 on a side of the glass core 202. The glass core 202 and the capacitor 210 may be similar to glass core 102 and capacitor 110 of FIG. 1. In embodiments, a surface of the glass core 202 includes a recess 203 within the surface. The recess 203 may be formed using the techniques described below with respect to FIG. 6.

In embodiments, the capacitor 210 includes two stacked capacitors, similar to capacitors 110 of FIG. 1. In particular, a first metal layer 212 may be placed upon the surface of the glass core 202. A first film dielectric 214 may be placed upon the first metal layer 212, and a second metal layer 216 may be placed upon the first film dielectric 214. A second film dielectric 238 may be placed upon the second metal layer 216, and a third metal layer 240 may be placed on the second film dielectric 238. A third film dielectric layer 242 may be placed on the third metal layer 240, and a fourth metal layer 244 placed upon the third film dielectric layer 242.

In addition, the second metal layer 216 and the fourth metal layer 244 may be electrically coupled using electrical connection 250. In embodiments, the electrical connection 250 may include one or more vias or through holes filled with conductive elements within a buildup layer above the glass core 202. The first metal layer 214 and the third metal layer 240 may be electrically coupled using electrical connection 252, which may be similar to electrical connection 250. As shown, the first metal layer 212 and the third metal layer 240 will be electrically coupled and electrically isolated from the second metal layer 216 and the fourth metal layer 244.

Figure 3:
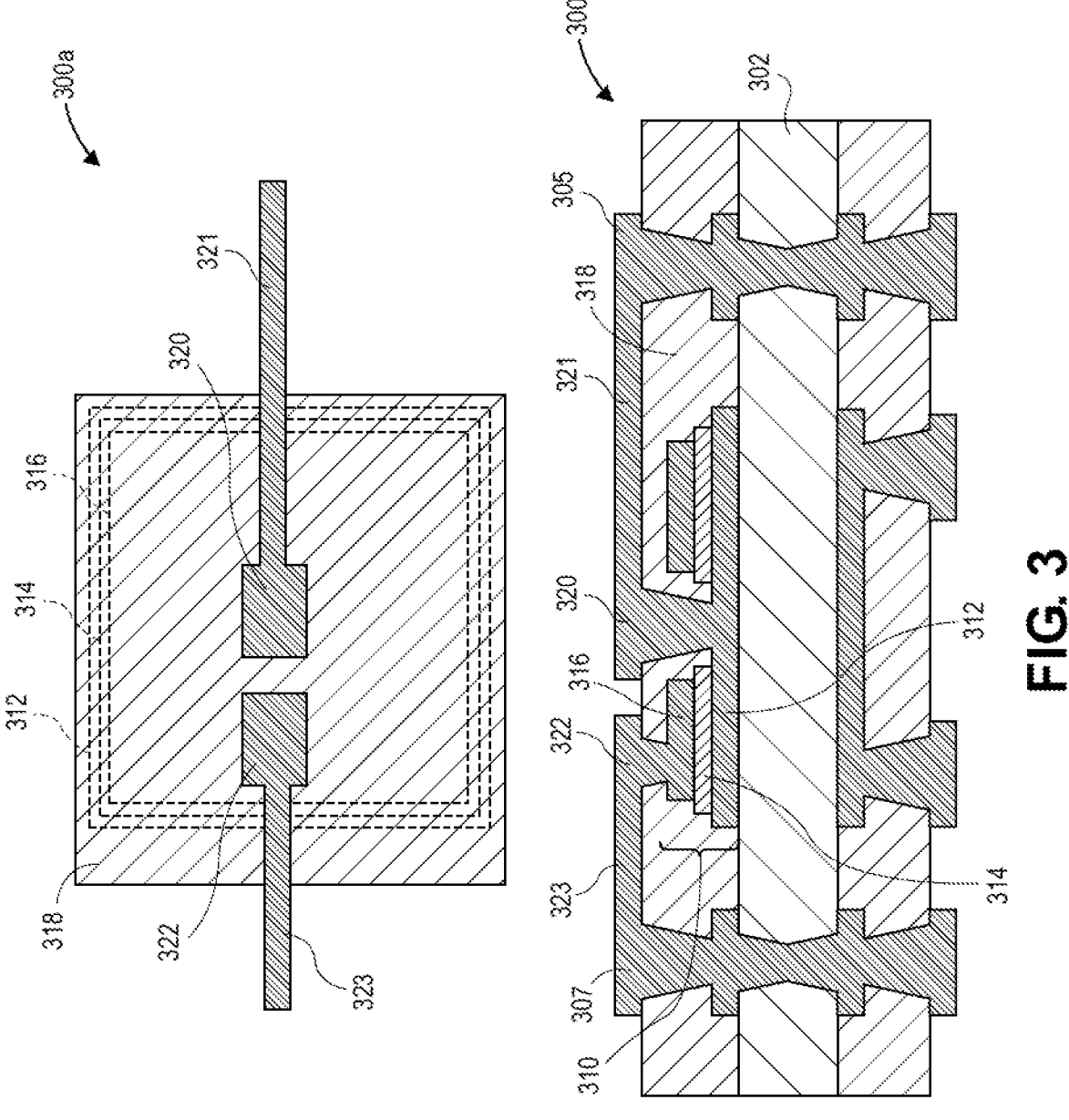
FIG. 3 illustrates a top view and a cross section side view of a package with a glass core with a thin film capacitor on a side of the glass core that is electrically coupled to through glass vias (TGV) filled with copper, in accordance with various embodiments.

FIG. 3 illustrates a top view and a cross section side view of a package with a glass core with a thin film capacitor on a side of the glass core that is electrically coupled to TGVs filled with copper, in accordance with various embodiments. Cross section side view 300 and top-down view 300a shows a package that includes a glass core 302, a thin film capacitor 310, and pads 305, 307, and pads 320, 322, which may be similar to glass core 102, thin film capacitor 110, pads 105, 107, and pad 122 and electrical coupling 120 of FIG. 1.

Pad 307 may be electrically coupled, through glass core 302, to a Vdd or Vss, and pad 305 may be electrically coupled, through glass core 302, to a Vss or Vdd. Pad 307 is electrically coupled via routing layer 323 to pad 322, which in turn is electrically coupled to the second metal layer 316, which may be similar to second metal layer 116 of FIG. 1. Pad 305 is electrically coupled via routing layer 321 to pad 320. Pad 320 is electrically coupled with the first metal layer 312, which may be similar to first metal layer 112 of FIG. 1. A film dielectric 314, which may be similar to film dielectric 114 of FIG. 1, electrically isolates the first metal layer 312 and the second metal layer 316. In embodiments, a dielectric material 318, which may be similar to dielectric material 118 of FIG. 1, may be placed within the package 300 to electrically isolate various components as discussed above.

It should be appreciated that the number and/or dimension of metal and dielectric layers within the thin film capacitor 310, as well as the electrical routings structures within the package 300, may vary. These variations may be based upon power and size requirements of the package 300 and any dies (not shown) that may attach to the top of and receive power from the package 300.

Figure 4:
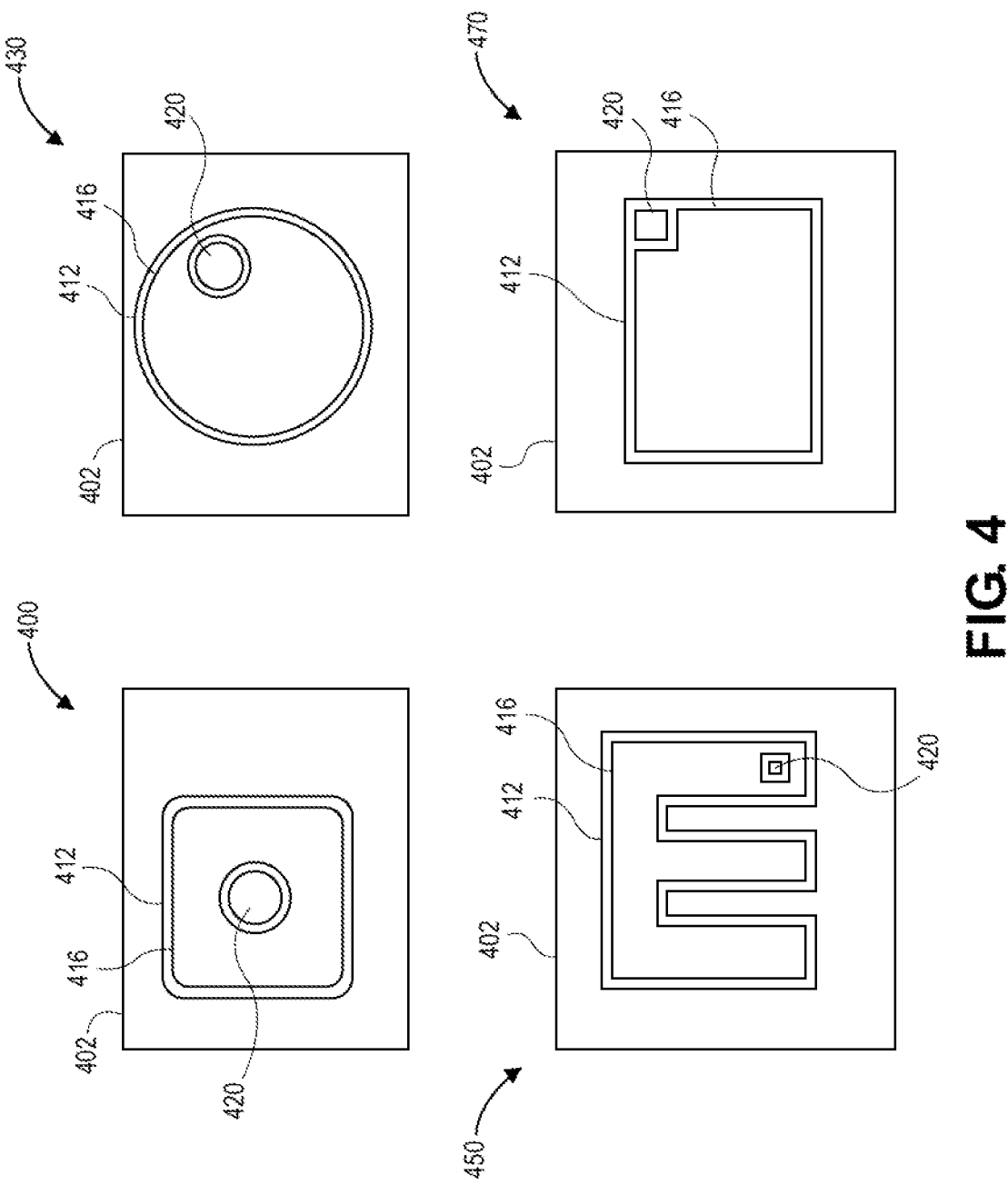
FIG. 4 illustrates several top views of various layer geometries of the thin film capacitor, in accordance with various embodiments.

FIG. 4 illustrates several top views of various layer geometries of the thin film capacitor, in accordance with various embodiments. Top-down views of diagrams 400, 430, 450, and 470, which may be similar to top-down view 300a of FIG. 3, show various patterns of a first metal layer and a second metal layer of a thin film capacitor.

Diagram 400 shows a glass core 402 that has a first metal layer 412, and a second metal layer 416 on top of the first metal layer 412. The dielectric separating these two metal layers is not shown for clarity, however the two metal layers are electrically isolated from each other by the dielectric. The metal layers are in a substantially square shape, with an electrical coupling 420 that is electrically isolated from the second metal layer 416 but extends down toward and is in electrical contact with the first electrical layer 412.

Diagram 430, which is similar to diagram 400, shows a glass core 402, the first metal layer 412, and the second metal layer 416, however they are in a substantially circular shape. The electrical coupling 420 is within the second metal layer 416 but is offset near an edge of the metal layers.

Diagram 450, which is similar to diagram 400, shows a glass core 402, the first metal layer 412, and the second metal layer 416 that are in an irregular shape. In embodiments, such an irregular shape may be chosen based on capacitance requirements that necessitate routing around the traces or other elements that may be within a buildup layer on either side of the glass core 402. The electrical coupling 420 is within the second metal layer 416, but is located near an edge of the metal layer structures.

Diagram 470, which is similar to diagram 400, shows a glass core 402, the first metal layer 412, and the second metal layer 416 that does not overlap metal layer 412 proximate to the electrical coupling 420.

FIGS. 5A-5G illustrate stages in the manufacturing process for creating a thin film capacitor on a side of a glass core, in accordance with various embodiments. The various manufacturing stages described herein may use techniques, processes, apparatus, or systems described with respect to FIGS. 1-4 and 6-9.

Figures 5A, 5B, 5C, 5D:
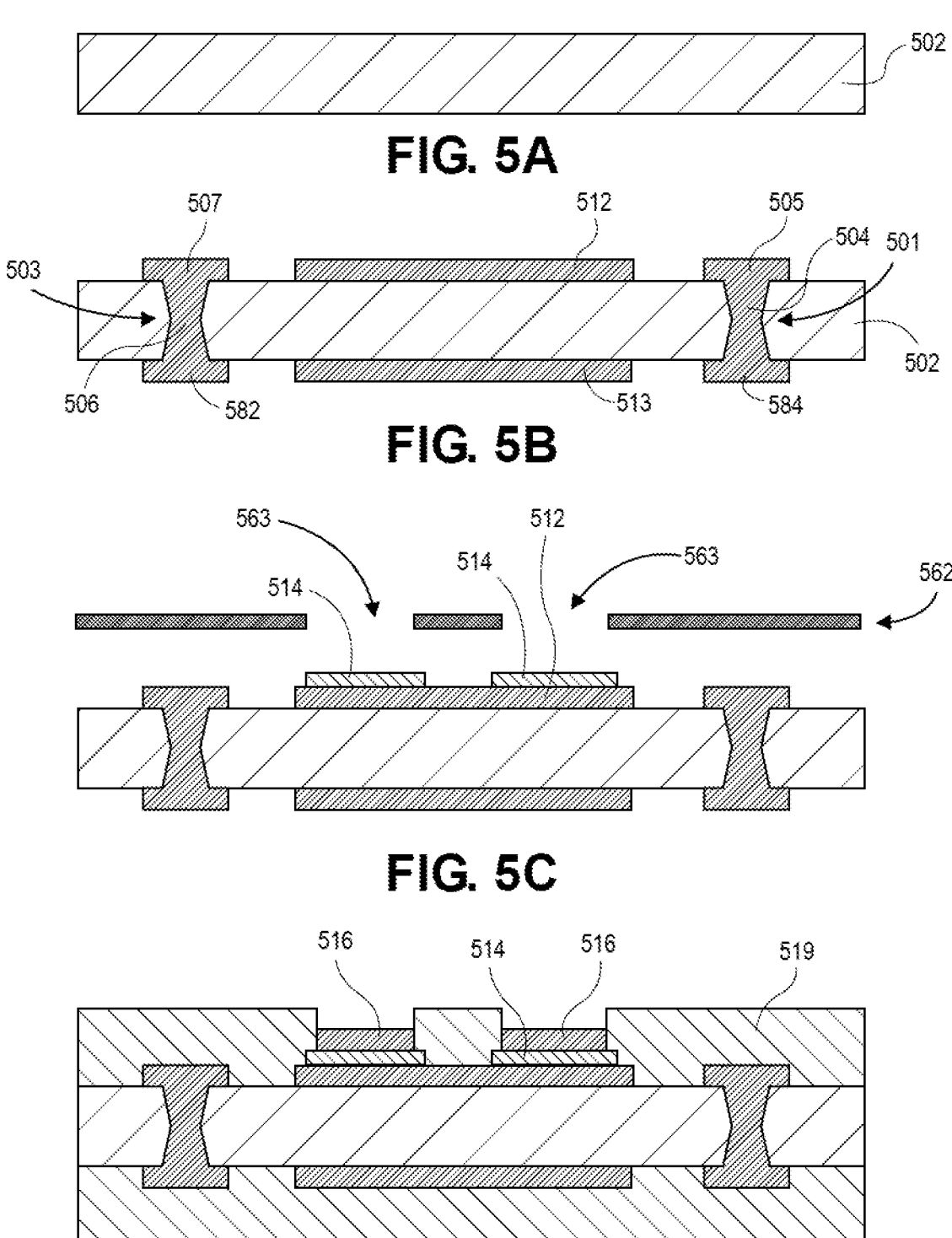
FIGS. 5A-5G illustrate stages in the manufacturing process for creating a thin film capacitor on a side of a glass core, in accordance with various embodiments.

FIG. 5A shows a stage in the manufacturing process where a glass core 502 is identified. In embodiments, the glass core 502 may be similar to glass core 102 of FIG. 1. In embodiments, a thickness of the glass core 502 may range up to 2 millimeters.

FIG. 5B shows a stage in the manufacturing process where TGVs 501, 503 were formed within the glass core 502. In embodiments, the TGVs 501, 503 may be formed using the techniques described below with respect to FIG. 6. The TGVs 501, 503 are filled with an electrically conductive material, such as copper, to form connectors 504, 506, which may be similar to filled TGV 104, 106 of FIG. 1. A metallization process may then be applied to form pads 507 and 505, which may be similar to pads 107 and 105 of FIG. 1. The metallization process also forms the first metal layer 512, which may be similar to first metal layer 112 of FIG. 1. Other metallization layers, such as layer 513 that is on an opposite side of the first metal layer 512, as well as other pads 582, 584, may also be formed.

FIG. 5C shows a stage in the manufacturing process where a mask 562 is placed proximate to the first metal layer 512, to form a film dielectric 514, which may be similar to film dielectric 114 of FIG. 1. In embodiments, the mask 562 may include openings 563 above the desired location of the film dielectric 514. The mask 562 may be used for sputtering the film dielectric 514 onto the first metal layer 512. In other embodiments, the film dielectric 514 may be applied using printing techniques, for example applied by an inkjet printer. A high temperature anneal process may subsequently be performed to cure or sinter the film dielectric 514.

FIG. 5D shows a stage in the manufacturing process where a solder resist material 519 is applied. In embodiments, the second metal layer 516 may be applied directly onto the film dielectric 514 subsequent to a lithography process or a drilling process to expose the film dielectric 514. A metallization process is then used to subsequently apply the second metal layer 516.

Figure 5E:
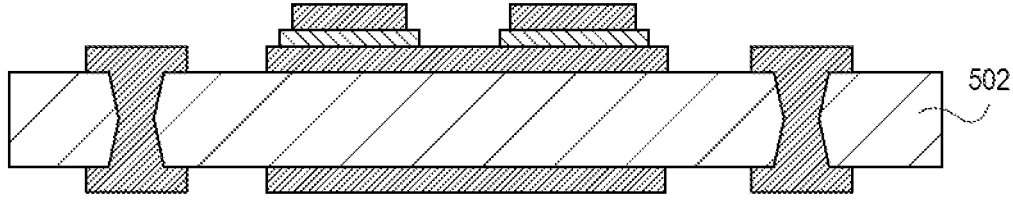

FIG. 5E shows a stage in the manufacturing process where the solder resist 519 is removed, and any copper seed (not shown) is also removed.

Figure 5F:
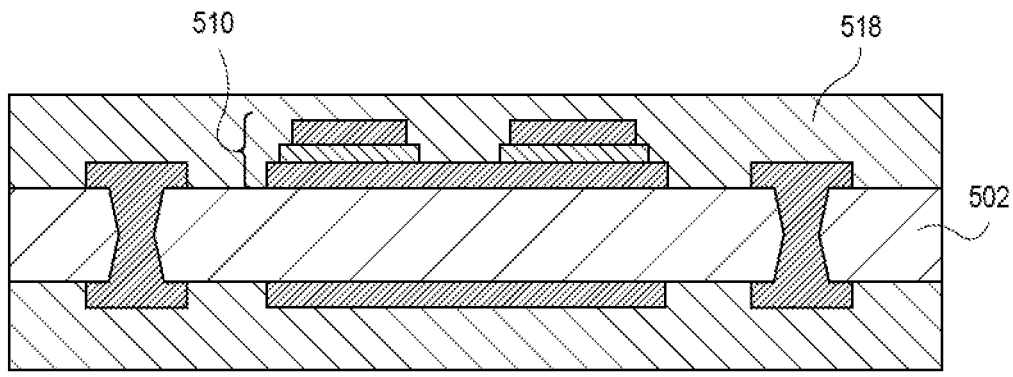

FIG. 5F shows a stage in the manufacturing process where a dielectric 518, which may be similar to dielectric 118 of FIG. 1, is laminated onto the glass core 502 and surrounding structures.

Figure 5G:
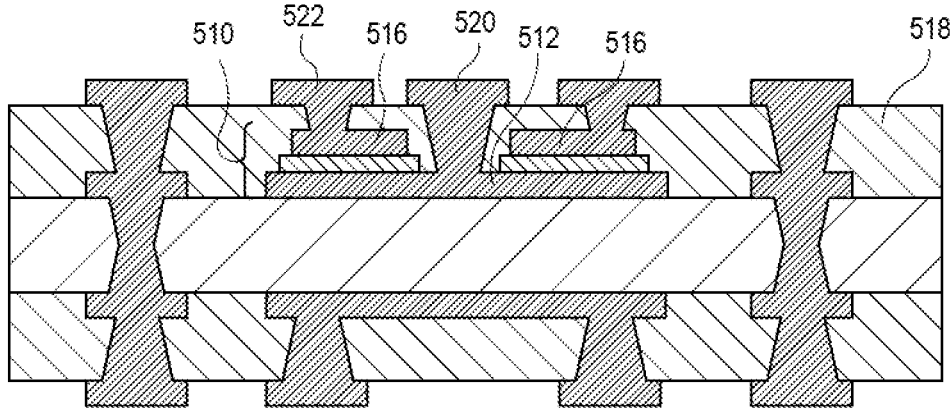

FIG. 5G shows a stage in the manufacturing process where the dielectric 518 has been drilled at various locations and metallization techniques have been applied. These techniques are used to form and to electrically couple the capacitor 510, which may be similar to capacitor 110 of FIG. 1, at the first metal layer 512 with the electrical coupling 520, and at the second metal layer 516 with pads 522.

Figure 6:
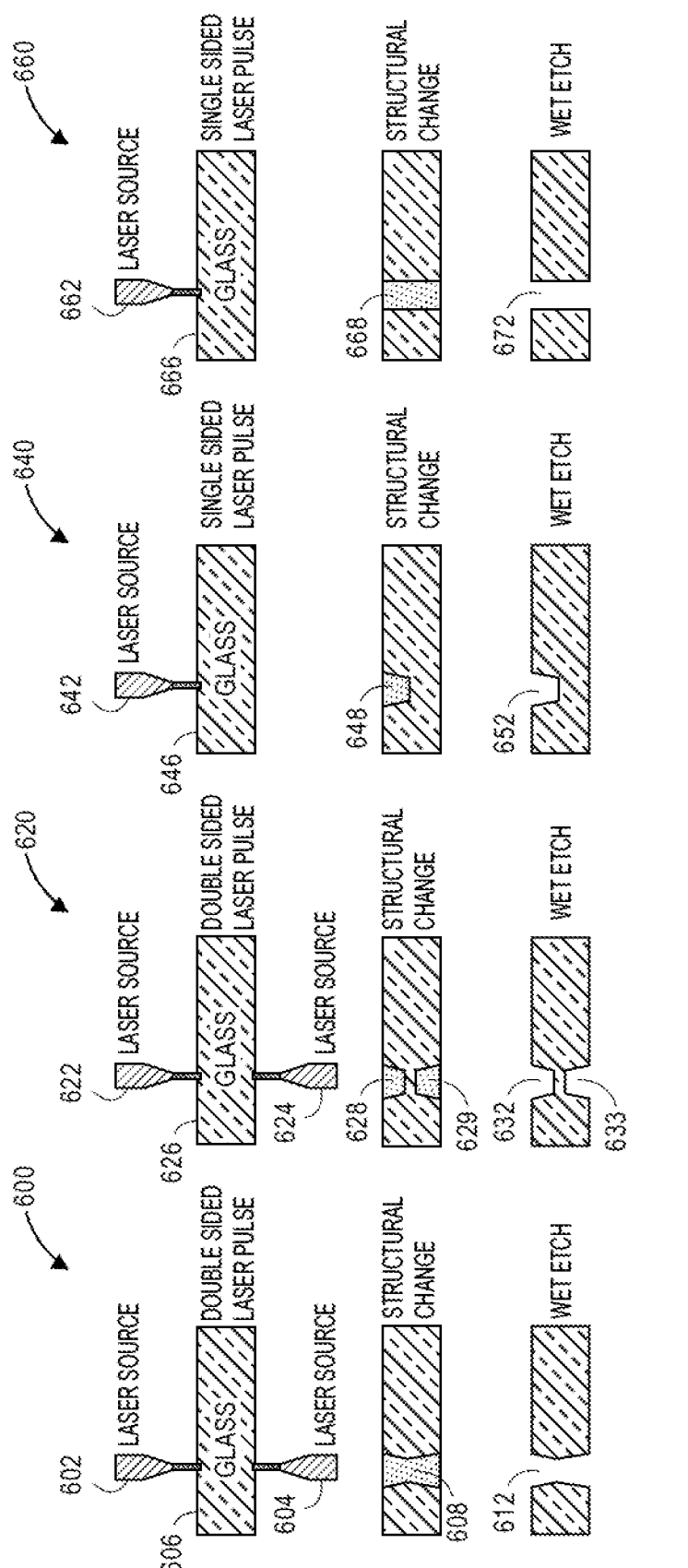
FIG. 6 illustrates multiple examples of laser-assisted etching of glass interconnects processes, in accordance with various embodiments.

FIG. 6 illustrates multiple examples of laser-assisted etching of glass interconnects processes, in accordance with various embodiments. FIG. 6 illustrates multiple examples of laser-assisted etching of glass interconnects processes (which may be referred to as "LEGIT" herein), in accordance with embodiments. One use of the LEGIT technique is to provide an alternative substrate core material to the legacy copper clad laminate (CCL) core used in semiconductor packages used to implement products such as servers, graphics, clients, 5G, and the like. By using laser-assisted etching, crack free, high density via drills, hollow shapes may be formed into a glass substrate. In embodiments, different process parameters may be adjusted to achieve drills of various shapes and depths, thus opening the door for innovative devices, architectures, processes, and designs in glass. Embodiments, such as the bridge discussed herein, may also take advantage of these techniques.

Diagram 600 shows a high level process flow for a through via and blind via (or trench) in a microelectronic package substrate (e.g. glass) using LEGIT to create a through via or a blind via. A resulting volume/shape of glass with laser-induced morphology change that can then be selectively etched to create a trench, a through hole or a void that can be filled with conductive material. A through via 612 is created by laser pulses from two laser sources 602, 604 on opposite sides of a glass wafer 606. As used herein, a through drill and a through via refers to when the drill or the via starts on one side of the glass/substrate and ends on the other side. A blind drill and a blind via refers to when the drill or the via starts on the surface of the substrate and stops half way inside the substrate. In embodiments, the laser pulses from the two laser sources 602, 604 are applied perpendicularly to the glass wafer 606 to induce a morphological change 608, which may also be referred to as a structural change, in the glass that encounters the laser pulses. This morphological change 608 includes changes in the molecular structure of the glass to make it easier to etch out (remove a portion of the glass). In embodiments, a wet etch process may be used.

Diagram 620 shows a high level process flow for a double blind shape. A double blind shape 632, 633 may be created by laser pulses from two laser sources 622, 624, which may be similar to laser sources 602, 604, that are on opposite sides of the glass wafer 626, which may be similar to glass wafer 606. In this example, adjustments may be made in the laser pulse energy and/or the laser pulse exposure time from the two laser sources 622, 624. As a result, morphological changes 628, 629 in the glass 626 may result, with these changes making it easier to etch out portions of the glass. In embodiments, a wet etch process may be used.

Diagram 640 shows a high level process flow for a single-blind shape, which may also be referred to as a trench. In this example, a single laser source 642 delivers a laser pulse to the glass wafer 646 to create a morphological change 648 in the glass 646. As described above, these morphological changes make it easier to etch out a portion of the glass 652. In embodiments, a wet etch process may be used.

Diagram 660 shows a high level process flow for a through via shape. In this example, a single laser source 662 applies a laser pulse to the glass 666 to create a morphological change 668 in the glass 666, with the change making it easier to etch out a portion of the glass 672. As shown here, the laser pulse energy and/or laser pulse exposure time from the laser source 662 has been adjusted to create an etched out portion 672 that extends entirely through the glass 666.

With respect to FIG. 6, although embodiments show laser sources 602, 604, 622, 624, 642, 662 as perpendicular to a surface of the glass 606, 626, 646, 666, in embodiments, the laser sources may be positioned at an angle to the surface of the glass, with pulse energy and/or pulse exposure time variations in order to cause a diagonal via or a trench, or to shape the via, such as 612, 672, for example to make it cylindrical, tapered, or include some other feature. In addition, varying the glass type may also cause different features within a via or a trench as the etching of glass is strongly dependent on the chemical composition of the glass.

In embodiments using the process described with respect to FIG. 6, through hole vias 612, 672 may be created that are less than 10 μm in diameter, and may have an aspect ratio of 40:1 to 50:1. As a result, a far higher density of vias may be placed within the glass and be placed closer to each other at a fine pitch. In embodiments, this pitch may be 50 μm or less. After creating the vias or trenches, a metallization process may be applied in order to create a conductive pathway through the vias or trenches, for example a plated through hole (PTH). Using these techniques, finer pitch vias will result in better signaling, allowing more I/O signals to be put through the glass wafer and to other coupled components such as a substrate.

Figure 7A:
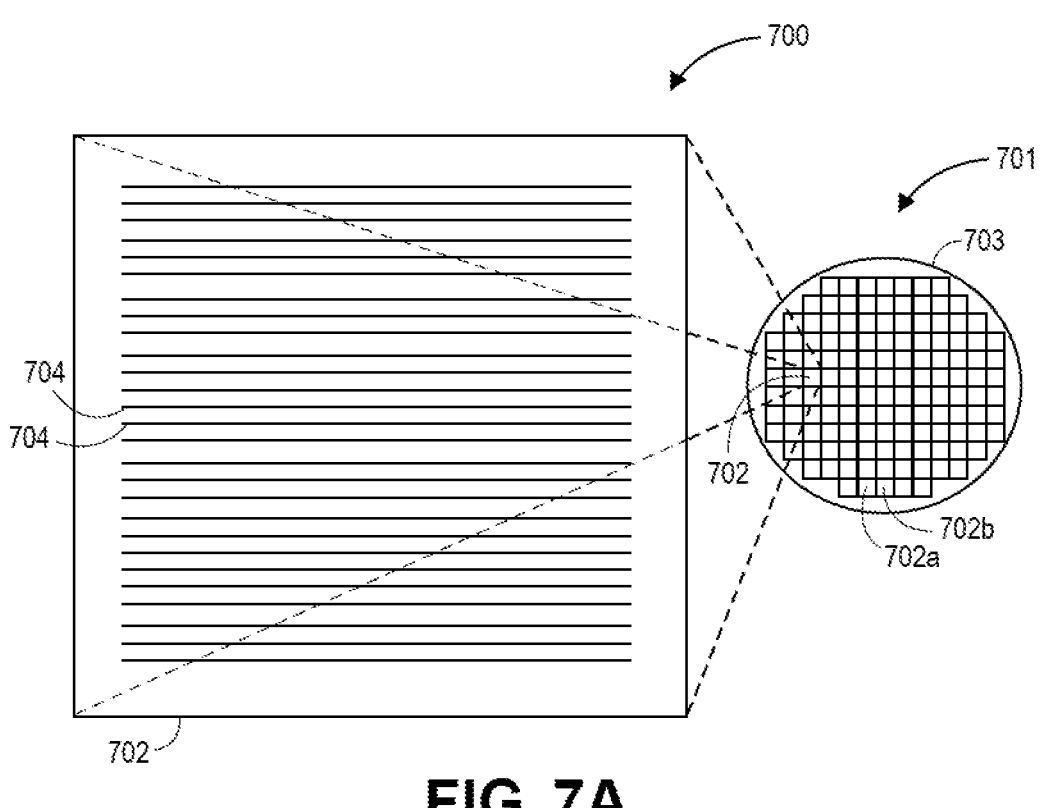
FIGS. 7A-7B schematically illustrate a top view of an example die in wafer form and in singulated form, and a cross section side view of a package assembly, in accordance with various embodiments.
Figure 7B:
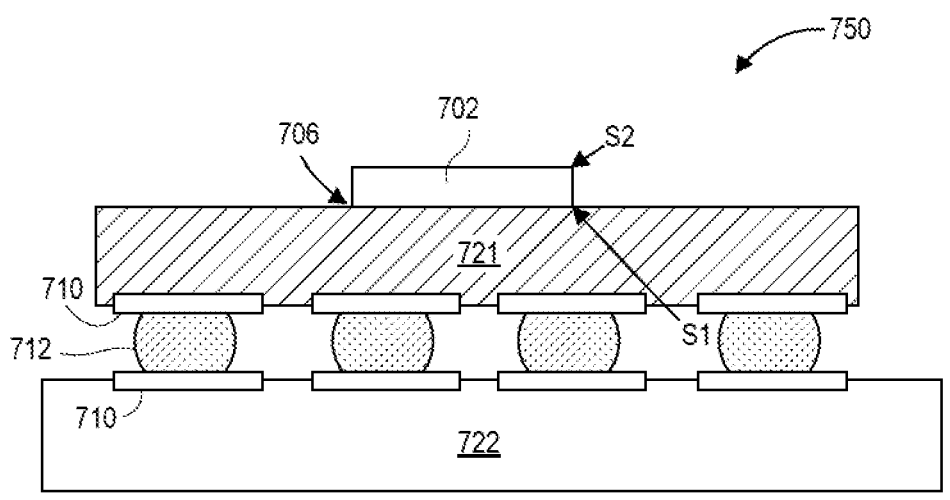

FIGS. 7A-7B schematically illustrate a top view of an example die in wafer form and in singulated form, and a cross section side view of a package assembly, in accordance with various embodiments. FIGS. 7A-7B schematically illustrate a top view of an example die in wafer form and in singulated form, and a cross section side view of a package assembly, in accordance with various embodiments. FIG. 7A schematically illustrates a top view of an example die 702 in a wafer form 701 and in a singulated form 700, in accordance with some embodiments. In some embodiments, die 702 may be one of a plurality of dies, e.g., dies 702, 702a, 702b, of a wafer 703 comprising semiconductor material, e.g., silicon or other suitable material. The plurality of dies, e.g., dies 702, 702a, 702b, may be formed on a surface of wafer 703. Each of the dies 702, 702a, 702b, may be a repeating unit of a semiconductor product that includes devices as described herein. For example, die 702 may include circuitry having elements such as capacitors and/or inductors 704 (e.g., fin structures, nanowires, and the like) that provide a channel pathway for mobile charge carriers in transistor devices. Although one or more capacitors and/or inductors 704 are depicted in rows that traverse a substantial portion of die 702, it is to be understood that one or more capacitors and/or inductors 704 may be configured in any of a wide variety of other suitable arrangements on die 702 in other embodiments.

After a fabrication process of the device embodied in the dies is complete, wafer 703 may undergo a singulation process in which each of dies, e.g., die 702, is separated from one another to provide discrete "chips" of the semiconductor product. Wafer 703 may be any of a variety of sizes. In some embodiments, wafer 703 has a diameter ranging from about 25.4 mm to about 450 mm. Wafer 703 may include other sizes and/or other shapes in other embodiments. According to various embodiments, the one or more capacitors and/or inductors 704 may be disposed on a semiconductor substrate in wafer form 701 or singulated form 700. One or more capacitors and/or inductors 704 described herein may be incorporated in die 702 for logic, memory, or combinations thereof. In some embodiments, one or more capacitors and/or inductors 704 may be part of a system-on-chip (SoC) assembly.

FIG. 7B schematically illustrates a cross-section side view of an integrated circuit (IC) assembly 750, in accordance with some embodiments. In some embodiments, IC assembly 750 may include one or more dies, e.g., die 702, electrically or physically coupled with a package substrate 721. Die 702 may include one or more capacitors and/or inductors 704 as described herein. In some embodiments, package substrate 721 may be electrically coupled with a circuit board 722 as is well known to a person of ordinary skill in the art. Die 702 may represent a discrete product made from a semiconductor material (e.g., silicon) using semiconductor fabrication techniques such as thin film deposition, lithography, etching, and the like. In some embodiments, die 702 may be, include, or be a part of a processor, memory, SoC or ASIC in some embodiments.

Die 702 can be attached to package substrate 721 according to a wide variety of suitable configurations including, for example, being directly coupled with package substrate 721 in a flip-chip configuration, as depicted. In the flip-chip configuration, an active side S1 of die 702 including circuitry is attached to a surface of package substrate 721 using hybrid bonding structures as described herein that may also electrically couple die 702 with package substrate 721. Active side S1 of die 702 may include multi-threshold voltage transistor devices as described herein. An inactive side S2 of die 702 may be disposed opposite to active side S1.

In some embodiments, package substrate 721 is an epoxy-based laminate substrate having a core and/or build-up layers such as, for example, an Ajinomoto Build-up Film (ABF) substrate. Package substrate 721 may include other suitable types of substrates in other embodiments including, for example, substrates formed from glass, ceramic, or semiconductor materials.

Package substrate 721 may include electrical routing features configured to route electrical signals to or from die 702. The electrical routing features may include pads or traces (not shown) disposed on one or more surfaces of package substrate 721 and/or internal routing features (not shown) such as trenches, vias, or other interconnect structures to route electrical signals through package substrate 721. In some embodiments, package substrate 721 may include electrical routing features such as pads (not shown) configured to receive the respective die-level interconnect structures 706 of die 702.

Circuit board 722 may be a printed circuit board (PCB) comprising an electrically insulative material such as an epoxy laminate. Circuit board 722 may include electrically insulating layers composed of materials such as, for example, polytetrafluoroethylene, phenolic cotton paper materials such as Flame Retardant 4 (FR-4), FR-1, cotton paper and epoxy materials such as CEM-1 or CEM-3, or woven glass materials that are laminated together using an epoxy resin prepreg material. Interconnect structures such as traces, trenches, vias may be formed through the electrically insulating layers to route the electrical signals of die 702 through circuit board 722. Circuit board 722 may comprise other suitable materials in other embodiments. In some embodiments, circuit board 722 is a motherboard as is well known to a person of ordinary skill in the art.

Package-level interconnects such as, for example, solder balls 712 may be coupled to one or more pads 710 on package substrate 721 and/or on circuit board 722 to form corresponding solder joints that are configured to further route the electrical signals between package substrate 721 and circuit board 722. Pads 710 may comprise any suitable electrically conductive material such as metal including, for example, nickel (Ni), palladium (Pd), gold (Au), silver (Ag), copper (Cu), and combinations thereof. Other suitable techniques to physically and/or electrically couple package substrate 721 with circuit board 722 may be used in other embodiments.

IC assembly 750 may include a wide variety of other suitable configurations in other embodiments including, for example, suitable combinations of flip-chip and/or wire-bonding configurations, interposers, multi-chip package configurations including system-in-package (SiP), and/or package-on-package (POP) configurations. Other suitable techniques to route electrical signals between die 702 and other components of IC assembly 750 may be used in some embodiments.

A person of ordinary skill in the art should recognize that any known semiconductor device fabricated using any known semiconductor process that may benefit from the principles described herein.

Figure 8:
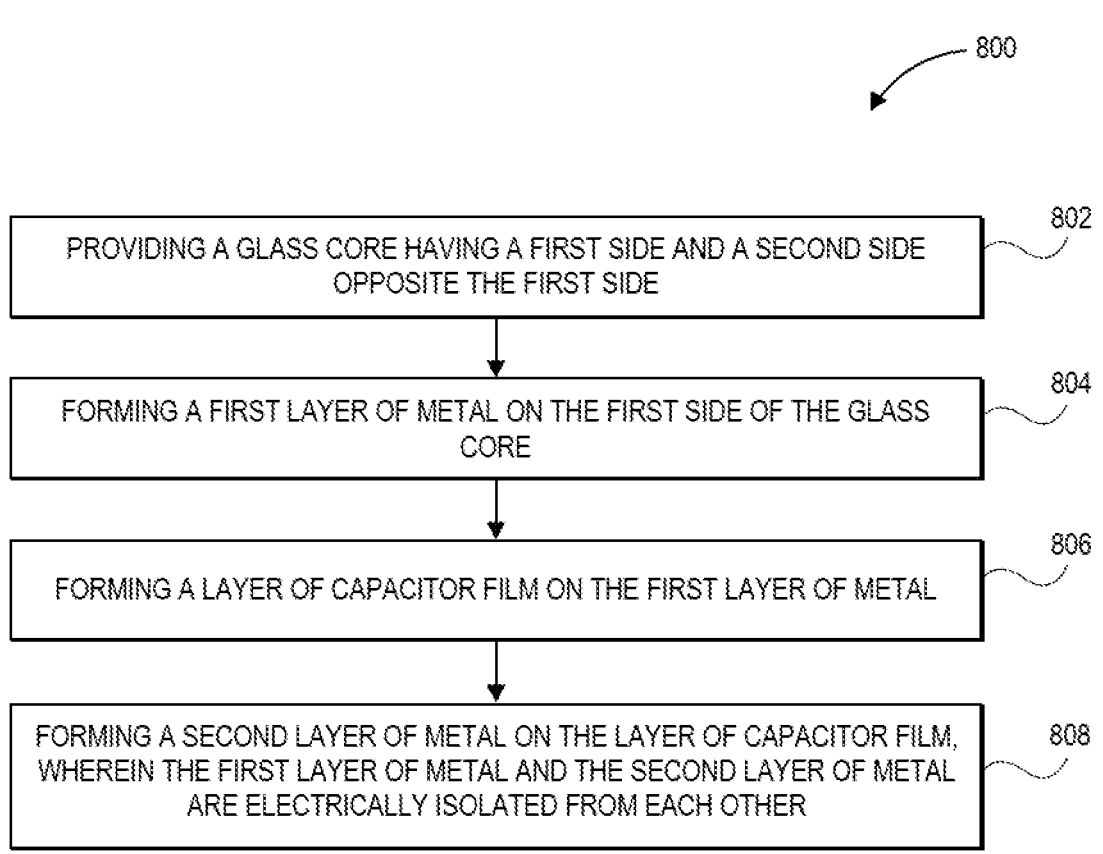
FIG. 8 illustrates an example of a process for creating a thin film capacitor on a glass substrate, in accordance with various embodiments.

FIG. 8 illustrates an example of a process for creating a thin film capacitor on a glass substrate, in accordance with various embodiments. Process 800 may be performed using any of the techniques, systems, apparatus, or process described herein, and in particular with respect to FIGS. 1-7B.

At block 802, the process may include providing a glass core having a first side and a second side opposite the first side.

At block 804, the process may further include forming a first layer of metal on the first side of the glass core.

At block 806, the process may further include forming a layer of capacitor film on the first layer of metal.

At block 808, the process may further include forming a second layer of metal on the layer of capacitor film, wherein the first layer of metal and the second layer of metal are electrically isolated from each other.

Figure 9:
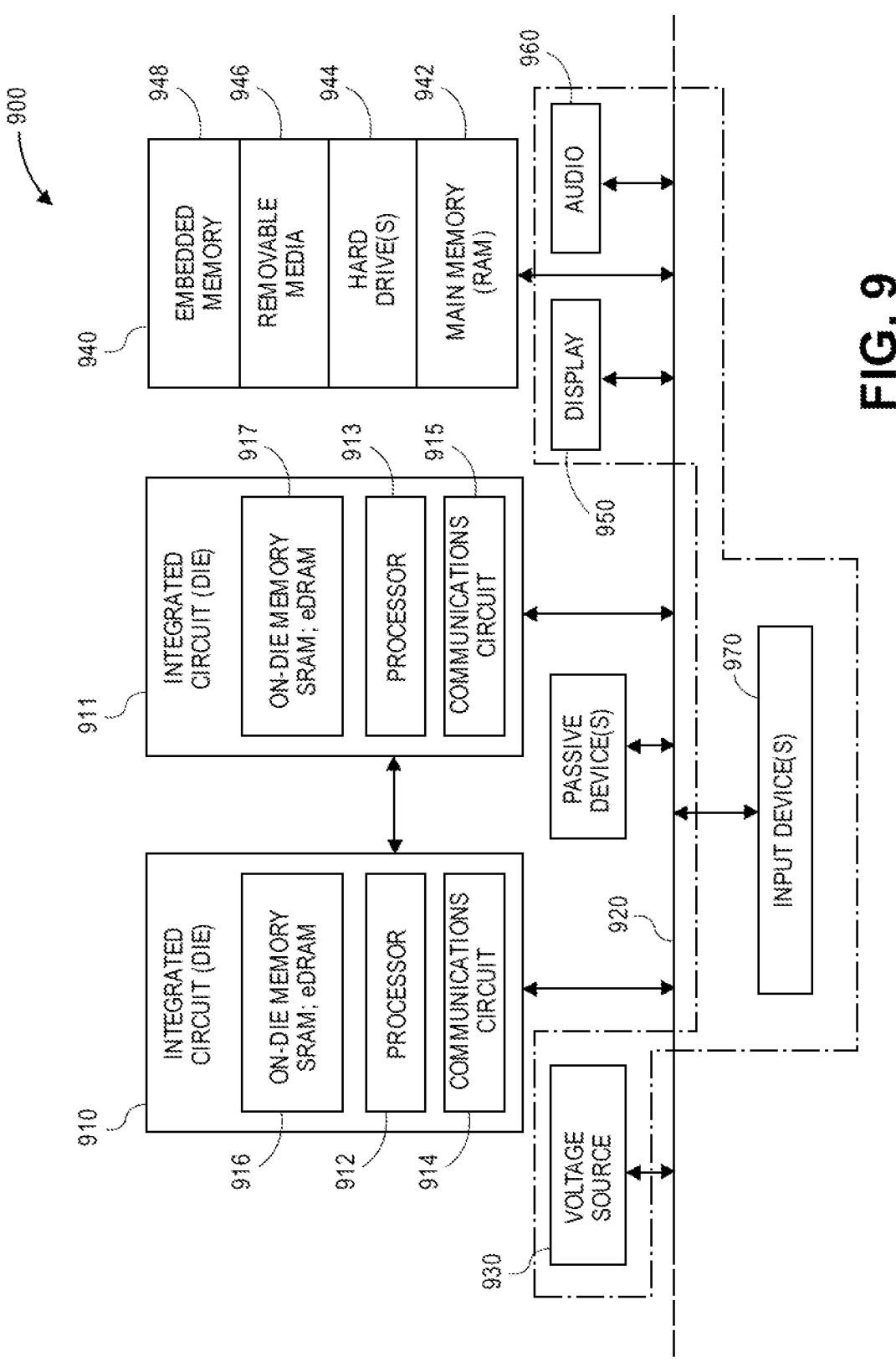
FIG. 9 schematically illustrates a computing device, in accordance with embodiments.

FIG. 9 is a schematic of a computer system 900, in accordance with an embodiment of the present invention. The computer system 900 (also referred to as the electronic system 900) as depicted can embody a film capacitor on a glass substrate, according to any of the several disclosed embodiments and their equivalents as set forth in this disclosure. The computer system 900 may be a mobile device such as a netbook computer. The computer system 900 may be a mobile device such as a wireless smart phone. The computer system 900 may be a desktop computer. The computer system 900 may be a hand-held reader. The computer system 900 may be a server system. The computer system 900 may be a supercomputer or high-performance computing system.

In an embodiment, the electronic system 900 is a computer system that includes a system bus 920 to electrically couple the various components of the electronic system 900. The system bus 920 is a single bus or any combination of busses according to various embodiments. The electronic system 900 includes a voltage source 930 that provides power to the integrated circuit 910. In some embodiments, the voltage source 930 supplies current to the integrated circuit 910 through the system bus 920.

The integrated circuit 910 is electrically coupled to the system bus 920 and includes any circuit, or combination of circuits according to an embodiment. In an embodiment, the integrated circuit 910 includes a processor 912 that can be of any type. As used herein, the processor 912 may mean any type of circuit such as, but not limited to, a microprocessor, a microcontroller, a graphics processor, a digital signal processor, or another processor. In an embodiment, the processor 912 includes, or is coupled with, a film capacitor on a glass substrate, as disclosed herein. In an embodiment, SRAM embodiments are found in memory caches of the processor. Other types of circuits that can be included in the integrated circuit 910 are a custom circuit or an application-specific integrated circuit (ASIC), such as a communications circuit 914 for use in wireless devices such as cellular telephones, smart phones, pagers, portable computers, two-way radios, and similar electronic systems, or a communications circuit for servers. In an embodiment, the integrated circuit 910 includes on-die memory 916 such as static random-access memory (SRAM). In an embodiment, the integrated circuit 910 includes embedded on-die memory 916 such as embedded dynamic random-access memory (eDRAM).

In an embodiment, the integrated circuit 910 is complemented with a subsequent integrated circuit 911. Useful embodiments include a dual processor 913 and a dual communications circuit 915 and dual on-die memory 917 such as SRAM. In an embodiment, the dual integrated circuit 910 includes embedded on-die memory 917 such as eDRAM.

In an embodiment, the electronic system 900 also includes an external memory 940 that in turn may include one or more memory elements suitable to the particular application, such as a main memory 942 in the form of RAM, one or more hard drives 944, and/or one or more drives that handle removable media 946, such as diskettes, compact disks (CDs), digital variable disks (DVDs), flash memory drives, and other removable media known in the art. The external memory 940 may also be embedded memory 948 such as the first die in a die stack, according to an embodiment.

In an embodiment, the electronic system 900 also includes a display device 950, an audio output 960. In an embodiment, the electronic system 900 includes an input device such as a controller 970 that may be a keyboard, mouse, trackball, game controller, microphone, voice-recognition device, or any other input device that inputs information into the electronic system 900. In an embodiment, an input device 970 is a camera. In an embodiment, an input device 970 is a digital sound recorder. In an embodiment, an input device 970 is a camera and a digital sound recorder.

As shown herein, the integrated circuit 910 can be implemented in a number of different embodiments, including a package substrate having a film capacitor on a glass substrate, according to any of the several disclosed embodiments and their equivalents, an electronic system, a computer system, one or more methods of fabricating an integrated circuit, and one or more methods of fabricating an electronic assembly that includes a package substrate having a film capacitor on a glass substrate, according to any of the several disclosed embodiments as set forth herein in the various embodiments and their art-recognized equivalents. The elements, materials, geometries, dimensions, and sequence of operations can all be varied to suit particular I/O coupling requirements including array contact count, array contact configuration for a microelectronic die embedded in a processor mounting substrate according to any of the several disclosed package substrates having a film capacitor on a glass substrate embodiments and their equivalents. A foundation substrate may be included, as represented by the dashed line of FIG. 9. Passive devices may also be included, as is also depicted in FIG. 9.

EXAMPLES

The following paragraphs describe examples of various embodiments.

Example 1 is a capacitor comprising: a layer of glass having a first side and a second side opposite the first side; a first layer of metal on the first side of the layer of glass; a layer of capacitor film on the first layer of metal; and a second layer of metal on the capacitor film, wherein the first layer of metal and the second layer of metal are electrically isolated from each other.

Example 2 includes the capacitor of example 1, or of any other example or embodiment herein, further comprising: an opening extending through the second layer of metal and the layer of capacitor film; and a metal contact within the opening, electrically and physically coupled with the first layer of metal and extending above the second layer of metal, wherein the metal contact and the second layer of metal are electrically isolated from each other.

Example 3 includes the capacitor of example 2, or of any other example or embodiment herein, further including a dielectric within the opening and at least partially surrounding the metal contact.

Example 4 includes the capacitor of example 2, or of any other example or embodiment herein, wherein the metal contact is a metal via.

Example 5 includes the capacitor of example 1, or of any other example or embodiment herein, wherein the layer of capacitor film is a first layer of capacitor film; and further comprising: a second layer of capacitor film on the second layer of metal; a third layer of metal on the second layer of capacitor film; and wherein the first layer of metal and the third layer of metal are electrically coupled, and wherein the third layer of metal and the second layer of metal are electrically isolated from each other.

Example 6 includes the capacitor of example 5, or of any other example or embodiment herein, further comprising: a third layer of capacitor film on the third layer of metal; a fourth layer of metal on the third layer of capacitor film; and wherein the second layer of metal and the fourth layer of metal are electrically coupled, and wherein the fourth layer of metal and the third layer of metal are electrically isolated from each other.

Example 7 includes the capacitor of example 1, or of any other example or embodiment herein, wherein the metal includes copper.

Example 8 includes the capacitor of example 1, or of any other example or embodiment herein, wherein the capacitor film includes a selected one or more of barium, titanium, and/or oxygen.

Example 9 includes the capacitor of example 1, or of any other example or embodiment herein, wherein the opening is at an edge of the layer of capacitor film second layer of metal.

Example 10 includes the capacitor example 1, or of any other example or embodiment herein, wherein the first layer of metal is electrically coupled with a Vdd and the second layer of metal is electrically coupled with a Vss.

Example 11 includes the capacitor of example 1, or of any other example or embodiment herein, wherein at least a portion of the first layer of metal is within a recess in the first side of the layer of glass.

Example 12 includes the capacitor of example 1, or of any other example or embodiment herein, wherein a thickness of the capacitor film is under 1 micrometer.

Example 13 includes the capacitor of example 1, or of any other example or embodiment herein, wherein the first layer of metal, the layer of capacitor film, and the second layer of metal are substantially planar.

Example 14 is a method comprising: providing a glass core having a first side and a second side opposite the first side; forming a first layer of metal on the first side of the glass core; forming a layer of capacitor film on the first layer of metal; and forming a second layer of metal on the layer of capacitor film, wherein the first layer of metal and the second layer of metal are electrically isolated from each other.

Example 15 includes the method of example 14, or of any other example or embodiment herein, further comprising: forming an opening extending through the second layer of metal and through the layer of capacitor film; and forming a metal contact within the opening and electrically and physically coupled with the first layer of the metal and extending above the second layer of metal, wherein the metal contact and second layer of metal or electrically isolated from each other.

Example 16 includes the method of example 15, or of any other example or embodiment herein, further including placing a dielectric within the opening and at least partially surrounding the metal contact.

Example 17 includes the method of example 15, or of any other example or embodiment herein, wherein forming a metal contact further includes: placing a dielectric within the formed opening; and forming a metal via within the dielectric, the metal via physically and electrically coupled with the first layer of metal and electrically isolated from the second layer of metal.

Example 18 includes the method of example 14, or of any other example or embodiment herein, wherein the metal includes copper.

Example 19 includes the method of example 14, or of any other example or embodiment herein, wherein the capacitor film includes a selected one or more of barium, titanium, and/or oxygen.

Example 20 is a package comprising: a substrate comprising: a glass core having a first side and a second side opposite the first side; a first layer of metal on the first side of the glass core; a layer of capacitor film on the first layer of metal; a second layer of metal on the layer of capacitor film, wherein the first layer of metal and the second layer of metal are electrically isolated from each other; an opening extending through the second layer of metal and through the layer of capacitor film to expose a surface of the first layer of metal; and a metal contact within the opening and electrically and physically coupled with the first layer of the metal and extending above the second layer of metal, wherein the metal contact and second layer of metal or electrically isolated from each other; and a die physically coupled with the first side of the glass core, wherein the die is electrically coupled with the metal contact and with the second layer of metal.

Example 21 includes the package of example 20, or of any other example or embodiment herein, wherein the substrate further comprises: a first through glass via (TGV) and a second TGV extending from the first side of the glass core to the second side of the glass core are filled with a conductive material and electrically couple the first side of the glass core with the second side of the glass core; and wherein the first TGV is electrically coupled with the first layer of metal and the second TGV is electrically coupled with the second layer of metal.

Example 22 includes the package of example 21, or of any other example or embodiment herein, wherein the first layer of metal, the layer of capacitor film, and the second layer of metal form a power source for the die.

Example 22 includes the package of example 21, or of any other example or embodiment herein, wherein the first TGV is coupled with a Vdd and the second TGV is coupled with a Vss.

Example 24 includes the package of example 20, or of any other example or embodiment herein, wherein the metal includes copper.

Example 25 includes the package of example 20, or of any other example or embodiment herein, wherein the capacitor film includes a selected one or more of: barium, titanium, and/or oxygen.

Various embodiments may include any suitable combination of the above-described embodiments including alternative (or) embodiments of embodiments that are described in conjunctive form (and) above (e.g., the "and" may be "and/or"). Furthermore, some embodiments may include one or more articles of manufacture (e.g., non-transitory computer-readable media) having instructions, stored thereon, that when executed result in actions of any of the above-described embodiments. Moreover, some embodiments may include apparatuses or systems having any suitable means for carrying out the various operations of the above-described embodiments.

The above description of illustrated embodiments, including what is described in the Abstract, is not intended to be exhaustive or to limit embodiments to the precise forms disclosed. While specific embodiments are described herein for illustrative purposes, various equivalent modifications are possible within the scope of the embodiments, as those skilled in the relevant art will recognize.

These modifications may be made to the embodiments in light of the above detailed description. The terms used in the following claims should not be construed to limit the embodiments to the specific implementations disclosed in the specification and the claims. Rather, the scope of the invention is to be determined entirely by the following claims, which are to be construed in accordance with established doctrines of claim interpretation.

What is claimed is:

1. A capacitor comprising:
a layer of glass having a first side and a second side opposite the first side;
a first layer of metal on the first side of the layer of glass;
a layer of capacitor film on the first layer of metal;
a second layer of metal on the capacitor film, wherein the first layer of metal and the second layer of metal are electrically isolated from each other;
a first conductive via extending through the layer of glass, the first conductive via coupled to the second layer of metal by a first routing layer; and
a second conductive via extending through the layer of glass, the second conductive via coupled to the first layer of metal by a second routing layer, the second routing layer in a same horizontal plane as the first routing layer.

2. The capacitor of claim 1, further comprising:
an opening extending through the second layer of metal and the layer of capacitor film; and
a metal contact within the opening, electrically and physically coupled with the first layer of metal and extending above the second layer of metal, wherein the metal contact and the second layer of metal are electrically isolated from each other.

3. The capacitor of claim 2, further including a dielectric within the opening and at least partially surrounding the metal contact.

4. The capacitor of claim 2, wherein the metal contact is a metal via.

5. The capacitor of claim 1, wherein the layer of capacitor film is a first layer of capacitor film; and
further comprising:
a second layer of capacitor film on the second layer of metal;
a third layer of metal on the second layer of capacitor film; and
wherein the first layer of metal and the third layer of metal are electrically coupled, and wherein the third layer of metal and the second layer of metal are electrically isolated from each other.

6. The capacitor of claim 5, further comprising:
a third layer of capacitor film on the third layer of metal;
a fourth layer of metal on the third layer of capacitor film; and
wherein the second layer of metal and the fourth layer of metal are electrically coupled, and wherein the fourth layer of metal and the third layer of metal are electrically isolated from each other.

7. The capacitor of claim 1, wherein the first layer of metal and the second layer of metal include copper.

8. The capacitor of claim 1, wherein the capacitor film includes a selected one or more of barium, titanium, and/or oxygen.

9. The capacitor of claim 1, wherein the opening is at an edge of the layer of capacitor film and the second layer of metal.

10. The capacitor claim 1, wherein the first layer of metal is electrically coupled with a Vdd and the second layer of metal is electrically coupled with a Vss.

11. The capacitor of claim 1, wherein at least a portion of the first layer of metal is within a recess in the first side of the layer of glass.

12. The capacitor of claim 1, wherein a thickness of the capacitor film is under 1 micrometer.

13. The capacitor of claim 1, wherein the first layer of metal, the layer of capacitor film, and the second layer of metal are substantially planar.

14. A method comprising:

providing a glass core having a first side and a second side opposite the first side;

forming a first layer of metal on the first side of the glass core;

forming a layer of capacitor film on the first layer of metal;

forming a second layer of metal on the layer of capacitor film, wherein the first layer of metal and the second layer of metal are electrically isolated from each other;

forming a first conductive via extending through the layer of glass, the first conductive via coupled to the second layer of metal by a first routing layer; and forming a second conductive via extending through the layer of glass, the second conductive via coupled to the first layer of metal by a second routing layer, the second routing layer in a same horizontal plane as the first routing layer.

15. The method of claim 14, further comprising:

forming an opening extending through the second layer of metal and through the layer of capacitor film; and forming a metal contact within the opening and electrically and physically coupled with the first layer of metal and extending above the second layer of metal, wherein the metal contact and second layer of metal are electrically isolated from each other.

16. The method of claim 15, further including placing a dielectric within the opening and at least partially surrounding the metal contact.

17. The method of claim 15, wherein forming the metal contact further includes:

placing a dielectric within the formed opening; and forming a metal via within the dielectric, the metal via physically and electrically coupled with the first layer of metal and electrically isolated from the second layer of metal.

18. The method of claim 14, wherein the first layer of metal and the second layer of metal include copper.

19. The method of claim 14, wherein the capacitor film includes a selected one or more of barium, titanium, and/or oxygen.

20. A package comprising:

a substrate comprising:

a glass core having a first side and a second side opposite the first side;

a first layer of metal on the first side of the glass core;

a layer of capacitor film on the first layer of metal;

a second layer of metal on the layer of capacitor film, wherein the first layer of metal and the second layer of metal are electrically isolated from each other;

a first conductive via extending through the glass core, the first conductive via coupled to the second layer of metal by a first routing layer;

a second conductive via extending through the glass core, the second conductive via coupled to the first layer of metal by a second routing layer, the second routing layer in a same horizontal plane as the first routing layer;

an opening extending through the second layer of metal and through the layer of capacitor film to expose a surface of the first layer of metal; and a metal contact within the opening and electrically and physically coupled with the first layer of the metal and extending above the second layer of metal, wherein the metal contact and second layer of metal are electrically isolated from each other; and a die physically coupled with the first side of the glass core, wherein the die is electrically coupled with the metal contact and with the second layer of metal.

21. The package of claim 20, wherein the first layer of metal, the layer of capacitor film, and the second layer of metal form a power source for the die.

22. The package of claim 20, wherein the first layer of metal and the second layer of metal include copper.

23. The package of claim 20, wherein the capacitor film includes a selected one or more of: barium, titanium, and/or oxygen.

\* \* \* \* \*